(12) United States Patent
Mochizuki et al.

(10) Patent No.: US 7,067,857 B2
(45) Date of Patent: Jun. 27, 2006

(54) SEMICONDUCTOR DEVICE HAVING LED OUT CONDUCTOR LAYERS, MANUFACTURING METHOD OF THE SAME, AND SEMICONDUCTOR MODULE

(75) Inventors: Kazuhiro Mochizuki, Tokyo (JP); Isao Ohbu, Sagamihara (JP); Tomonori Tanoue, Machida (JP); Chisaki Takubo, Kodaira (JP); Kenichi Tanaka, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/788,277

(22) Filed: Mar. 1, 2004

(65) Prior Publication Data

US 2004/0212034 A1    Oct. 28, 2004

(30) Foreign Application Priority Data

Apr. 23, 2003  (JP) .......................... P2003-118531

(51) Int. Cl.
  H01L 29/739   (2006.01)
  H01L 31/0328  (2006.01)
  H01L 31/0336  (2006.01)
  H01L 31/072   (2006.01)
  H01L 31/109   (2006.01)

(52) U.S. Cl. ...................... 257/197; 257/187; 257/198; 257/559; 257/565; 257/566; 257/571; 257/573; 257/586; 257/587

(58) Field of Classification Search ........ 257/565–566, 257/573, 586–587, 187, 197, 198, 559, 571
See application file for complete search history.

(56) References Cited

U.S. PATENT DOCUMENTS

| | | | | | |
|---|---|---|---|---|---|
| 3,761,782 | A | * | 9/1973 | Youmans | 257/778 |
| 3,974,560 | A | * | 8/1976 | Mueller et al. | 438/311 |
| 5,084,750 | A | * | 1/1992 | Adlerstein | 257/574 |
| 5,122,856 | A | * | 6/1992 | Komiya | 257/774 |
| 5,266,819 | A | * | 11/1993 | Chang et al. | 257/198 |
| 5,274,265 | A | * | 12/1993 | Tsuruta | 257/587 |
| 5,449,930 | A | * | 9/1995 | Zhou | 257/197 |
| 5,485,025 | A | * | 1/1996 | Chau et al. | 257/198 |
| 5,614,743 | A | * | 3/1997 | Mochizuki | 257/276 |
| 5,827,755 | A | * | 10/1998 | Yonehara et al. | 438/30 |
| 6,036,383 | A | * | 3/2000 | Lodwig et al. | 400/613 |
| 6,355,972 | B1 | * | 3/2002 | Van Rijs et al. | 257/586 |
| 6,696,711 | B1 | * | 2/2004 | Mochizuki et al. | 257/197 |
| 6,856,004 | B1 | * | 2/2005 | Kiaei et al. | 257/587 |
| 6,881,639 | B1 | * | 4/2005 | Mochizuki et al. | 438/312 |
| 2002/0137264 | A1 | * | 9/2002 | Kao et al. | 438/138 |
| 2002/0179913 | A1 | * | 12/2002 | Shirakawa | 257/79 |
| 2003/0011045 | A1 | * | 1/2003 | Kleel et al. | 257/587 |

* cited by examiner

OTHER PUBLICATIONS

Solid State Electronics, vol. 38, No. 9, 1995, "Optimization of the HBT and Bump Configuration for Bump Heat Sink Structure and Application to HBT Power MMICs", pp. 1653-1656, H. Sato et al.

*Primary Examiner*—Ida M. Soward
(74) *Attorney, Agent, or Firm*—Mattingly, Stanger, Malur & Brundidge, P.C.

(57) ABSTRACT

The gist of the present invention is as follows: In a monolithic microwave integrate circuit (MMIC) using a heterojunction bipolar transistor (HBT), via holes are respectively formed from the bottom of the MMIC for the emitter, base and collector. Of the via holes, one is located so as to face the HBT. The respective topside electrodes for the other via holes located so as not to face the HBT are provided in contact with the MMIC substrate.

5 Claims, 13 Drawing Sheets

SEMICONDUCTOR DEVICE HAVING LED OUT CONDUCTOR LAYERS, MANUFACTURING METHOD OF THE SAME, AND SEMICONDUCTOR MODULE

BACKGROUND OF THE INVENTION

The present invention relates to a structure and method for leading out conductor layers from a semiconductor device and, further, to a semiconductor module using such a semiconductor device. In particular, the present invention is usefully applicable to a power amplifier using heterojunction bipolar transistors. The present invention is also useful in achieving a high conversion efficiency power amplifier.

With the rapidly growing demand for mobile communication equipment, active research and development efforts are recently directed to power amplifiers for use in communication equipment. To meet the needs for smaller communication tools, MMICs (Monolithic Microwave Integrated Circuits) are used in power amplifier modules. An MMIC contains semiconductor chips together with passive elements. Transistors popular in these MMICs are heterojunction bipolar transistors (HBTS) due to superiority in power density and miniaturization. Especially in a miniaturization-oriented power amplifier module, a MMIC is mounted face down to a ceramic substrate by using metal bumps. A representative example of this technique is found, for example, in "Solid State Electronics" (Vol. 38, No. 9 (1995), pp. 1653–1656). Note that in this specification, monolithic microwave integrated circuits and heterojunction bipolar transistors are abbreviated as MMICs and HBTs respectively.

FIG. 9 shows a typical prior art example of this technique. FIG. 9 is a cross-sectional view of a power amplifier module. In the conventionally typical manufacturing method, a MMIC 100 is mounted face down to a module plate. The module plate shown as an example in FIG. 9 is composed of three substrates 121, 120 and 122. On the substrate 120, an emitter wiring pad 101, base wiring pad 102 and collector wiring pad 103 are arranged. For packages, low-temperature sintered glass ceramics plates with a dielectric constant of 8 have usually been used. The substrate 121 has an opening where the MMIC 100 is accommodated. Reference numeral 104 denotes a passive element fabricated as a chip part, 105 is a transmission line, 106 is a metal bump, 107 is a base input, 108 is a collector input, 109 and 110 are each a ground plane, 111 is a thermal via, 112 is a transmission line and 113 is a metal cap.

Since face down mounting is employed in FIG. 9, variations occur in the heights of metal bumps 106. This results in nonuniformity of the distance between the surface of the MMIC 100 and the surface of the module substrate 120 as indicated by d2 and d3 in FIG. 9. Accordingly, the drawback to this method is that due to variations in the capacitance parasitic to the MMIC 100, the power amplifier involves a variability of high frequency characteristics.

SUMMARY OF THE INVENTION

It is an object of the present invention to realize a semiconductor device which shows a reduced variability of high frequency characteristics and therefore preferably applicable to power amplifier modules. The present invention can provide smaller modules.

It is another object of the present invention to manufacture such semiconductor devices at low cost.

The gist of the present invention is that in a HBT-used MMIC, openings are formed respectively for the emitter, base and collector and one of the openings is formed from the bottom surface of the MMIC substrate and is located so as to face the HBT. Note that these openings are called via holes. Accordingly, the opening located to face the HBT is denoted here as a first via hole.

The above-mentioned and other objects can be achieved by forming a second and third via holes from the bottom of the MMIC substrate outside the HBT area and forming electrodes on the top side of the MMIC substrate for the second and third via holes so that they are in contact with the MMIC substrate.

Various aspects of the present invention according to the above-mentioned gist are described below.

According to a first aspect, there is provided a semiconductor device which has at least one semiconductor element formed on a semiconductor substrate, wherein conductor layers connected respectively to desired areas of the semiconductor element are led out of the semiconductor element from the side of the semiconductor element opposite to the side of the semiconductor substrate.

According to a second aspect, the semiconductor element according to the first aspect is a heterojunction bipolar transistor. This is preferable to provide a power amplifier superior in high frequency characteristics and a semiconductor module using such a power amplifier.

That is, according to the first and second aspects, the conductor layers connected respectively to the base, emitter and collector areas of the heterojunction bipolar transistor are led out of the heterojunction bipolar transistor from the bottom side of the semiconductor substrate.

According to a third aspect, the surface of the semiconductor substrate on which the base, emitter and collector areas are formed is the top surface of the semiconductor substrate while the opposite surface is the bottom surface of the semiconductor substrate.

According to a fourth aspect, at least a plurality of heterojunction bipolar transistors are formed on the semiconductor substrate. This has significance in practical use applications. This means the semiconductor device is an integrate circuit.

In this case, it is preferable that the base areas, emitter areas and collector areas of a desired number of heterojunction bipolar transistors are respectively coupled and lead out of the heterojunction bipolar transistors.

According to a fifth aspect, at least the collector area of the heterojunction bipolar transistor is higher than the base layer when viewed from the semiconductor substrate in the direction of stacking the semiconductor layers. That is, the heterojunction bipolar transistor is of the collector-top type.

According to a sixth aspect, at least the emitter area of the heterojunction bipolar transistor is higher than the base layer when viewed from the semiconductor substrate in the direction of stacking the semiconductor layers. That is, the heterojunction bipolar transistor is of the emitter-top type.

According to a seventh aspect, the bottom surface of the semiconductor substrate has a first opening located so as to face the heterojunction bipolar transistor and a second opening and a third opening both located so as not to face the heterojunction bipolar transistor; and the conductor layers connected respectively to the base, emitter and collector areas of the heterojunction bipolar transistor are led out of the heterojunction bipolar transistor through the first, second and third openings.

According to an eighth aspect, the heterojunction bipolar transistor is of the collector-top type; the first opening is an emitter via hole; and the second and third openings are respectively a base via hole and a collector via hole.

According to a ninth aspect, the first opening has a conductor layer formed therein and extended so as to cover a part of the surface of the semiconductor substrate opposite to the surface on which the base, emitter and collector areas are formed; the second and third openings have respectively conductive layers formed therein and extended so as to cover parts of both the surface of the semiconductor substrate on which the base, emitter and collector areas are formed and the opposite surface of the semiconductor substrate; and each of the first, second and third openings (conductors therein) is electrically separated from the others.

According to a tenth aspect, the first opening has a conductor layer formed therein and extended so as to cover a part of the surface of the semiconductor substrate opposite to the surface on which the base, emitter and collector areas are formed; the second and third openings have respectively conductive layers formed therein and extended so as to cover parts of both the surface of the semiconductor substrate on which the base, emitter and collector areas are formed and the opposite surface of the semiconductor substrate; and each of the first, second and third openings is electrically separated from the others.

According to an eleventh aspect, the conductor layer formed on the surface on which the base, emitter and collector regions of the semiconductor substrate provided for the second and third openings are formed is in contact with the semiconductor substrate. This facilitates the manufacture process since the openings have the same depth.

Then, various aspects concerning the manufacturing method are described below.

According to a twelfth aspect, there is provided a semiconductor device manufacturing method comprising the steps of: preparing a semiconductor substrate on which at least a semiconductor element portion is formed; selectively exposing the semiconductor substrate where the semiconductor element portion is not formed; coating the semiconductor substrate with an insulation film; selectively removing the insulation film where the insulation film is not necessary; coating the prepared semiconductor substrate with a metal layer; selectively removing the metal layer so that at least the insulation film-removed areas remain covered by metal layer pieces left; forming an opening where the metal layer pieces are left from the surface of the semiconductor substrate opposite to the surface on which the metal layer was formed; and forming, through the opening, a conductor layer which is electrically connected to the metal layer pieces left.

According to a thirteenth aspect, the step according to twelfth aspect of forming an opening at a portion where the metal layer pieces are left from the surface of the semiconductor substrate opposite to the surface on which the metal layer was formed includes forming an opening at a portion where the semiconductor element is formed from the surface of the semiconductor substrate opposite to the surface on which the semiconductor element is formed.

According to a fourteenth aspect, there is provided a device manufacturing method which complies with the thirteenth aspect and is characterized in that: the semiconductor element portion comprises a collector top type heterojunction bipolar transistor; at least two metal layer pieces that are respectively connected to the base and collector areas of the heterojunction bipolar transistor from the surface of the semiconductor substrate opposite to the other surface on which the metal layer was formed; two openings are formed in the surface of the semiconductor surface opposite to the other surface on which the metal layer was formed, so as to face the metal layer and are respectively provided for the base and collector areas; and an opening is formed in the surface of the semiconductor substrate opposite to the other surface on which the semiconductor element is formed, so as to face the semiconductor element and is provided for the emitter area.

Then, various aspects of the present invention concerning a semiconductor module are described below.

According to a fifteenth aspect, there is provided a semiconductor module which has at least a semiconductor element formed on a semiconductor substrate, wherein:

conductor layers connected respectively to desired areas of the semiconductor element are led out of the semiconductor element from the side of the semiconductor element opposite to the side of the semiconductor substrate; and the conductor layers are led out to the surface of the semiconductor substrate, opposite to the surface on which the semiconductor element is formed, and bonded to metal pads on the module plate via metal bumps.

According to a sixteen aspect, there is provided a semiconductor module which complies with the fifteenth aspect and is characterized in that the conductor layers are led out to the surface of the semiconductor substrate, opposite to the surface on which the semiconductor element is formed, via openings formed through the semiconductor substrate.

According to a seventeenth aspect, there is provided a semiconductor module which complies with the sixteen aspect and is characterized in that the semiconductor element is a heterojunction bipolar transistor.

DETAILED DESCRIPTION OF THE PREFERRED EMBODIMENTS

The basic concept to achieve the objects of the present invention is described below. In a HBT-used MMIC, a first, second and third via holes are formed from the bottom surface of the MMIC. This makes it possible to mount the MMIC face up on a power amplifier module plate. Thus, capacitances parasitic to the connections between the MMIC's conductor layers and the module plate can be reduced. In addition, the variability of the capacitance parasitic to each conductor layer can be limited. This makes it possible to prepare a power amplifier module superior in high frequency characteristic.

In this case, if the first via hole is located so as to face the HBT, the area used to metal bums on the bottom surface of the MMIC can be minimized. This makes it possible to realize a smaller MMIC and therefore a smaller power amplifier module using the MMIC.

Figure 14:
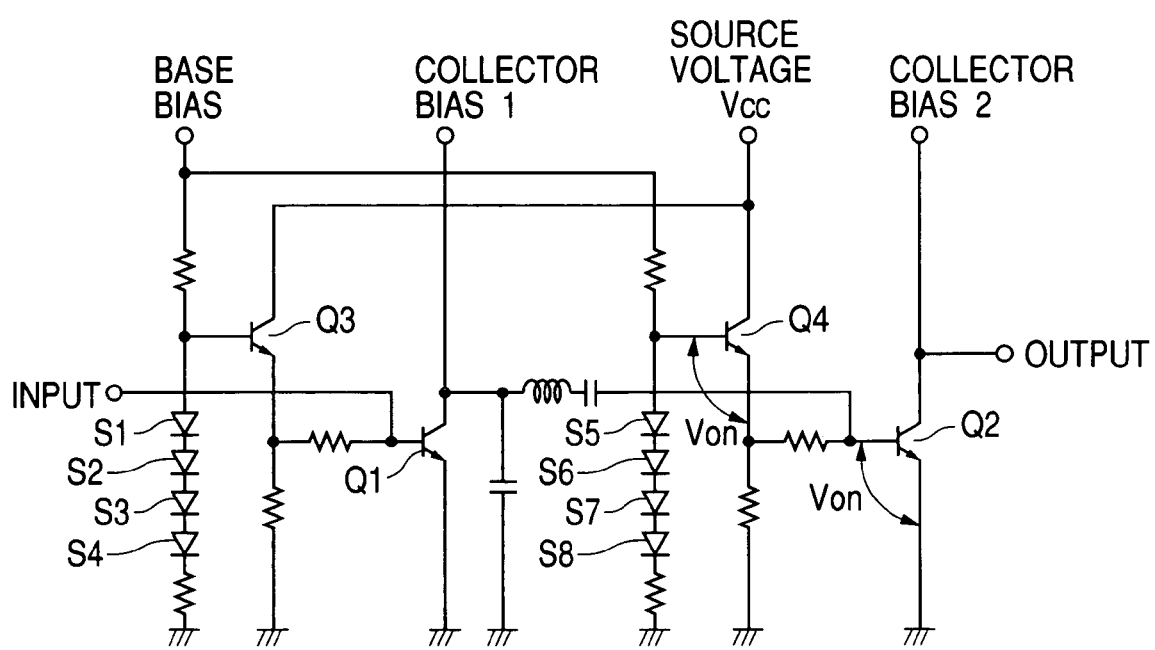
FIG. 14 shows an example of a power amplifier circuit configuration.

FIG. 14 shows a typical example of a power amplifier. Like common power amplifiers, HBTs Q1 and Q2 are used as emitter-grounded transistor as shown in FIG. 14. Therefore, these should be mounted collector top instead of emitter top to miniaturize the MMIC and the power amplifier module. This is because in the case of a collector-top HBT, a first via hole formed as a bottom emitter can be shared by a plurality of HBT fingers formed in the MMIC. In the case of an emitter-top HBT, since sharing of a collector electrode is not possible, it is necessary to form fine via holes for the respective fingers and form a sizable wiring pattern for these via holes on the bottom of the MMIC. This enlarges the MMIC. Note that HBTs Q3 and Q4 are biasing transistors. They are not emitter-grounded. Therefore, these HBTs may satisfactorily be mounted emitter top.

To achieve the other object, the conductor layers formed respectively in the second and third via holes are designed to be in contact with the MMIC substrate. This facilitates the manufacture process since the first, second and third via holes have the same depth. In this case, these via holes can be formed by the same process, resulting in a lowered MMIC manufacture cost.

<First Embodiment>

Figure 1:
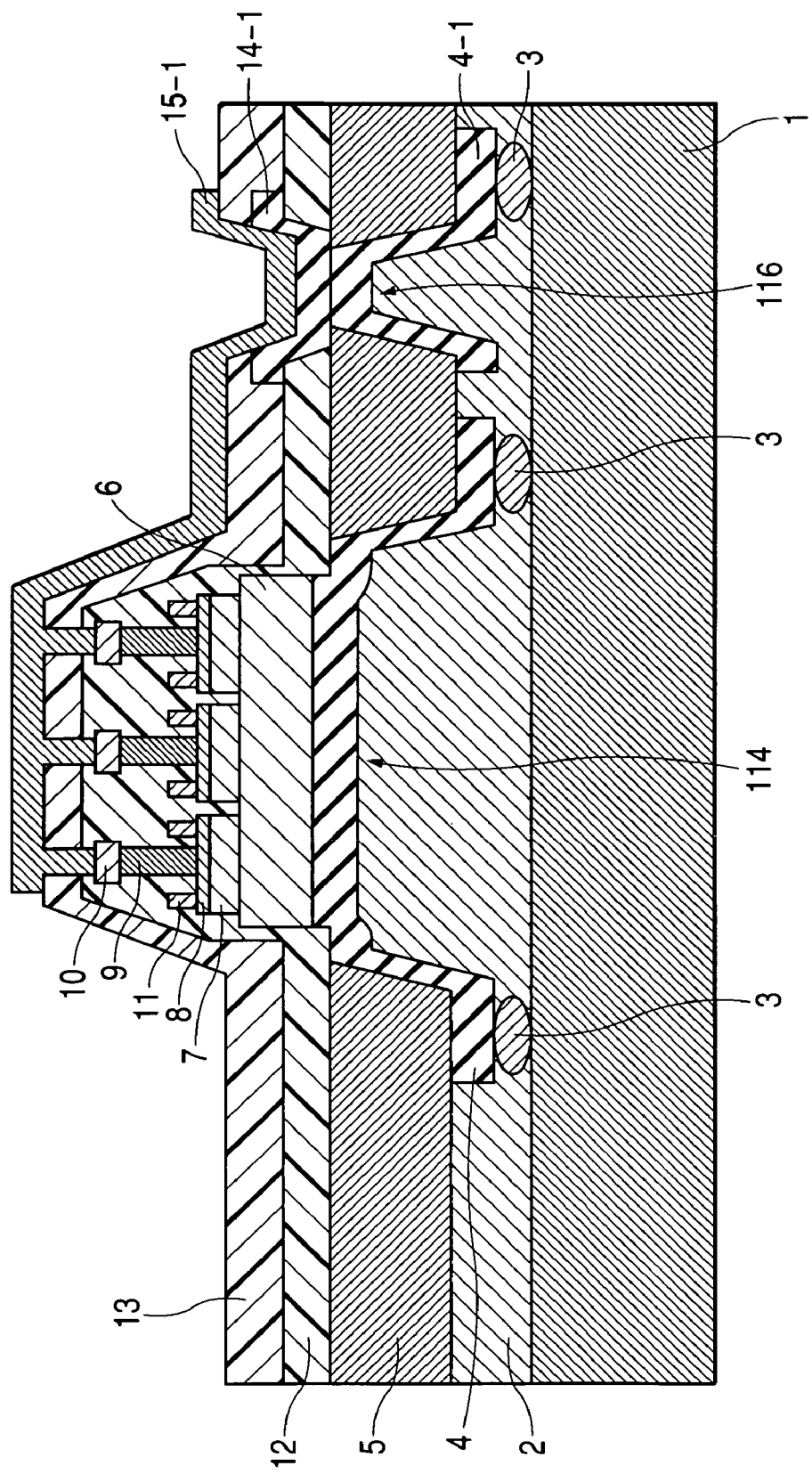
FIG. 1 is a vertical cross-sectional view of a collector top HBT-used semiconductor device according to the present invention, taken along line 1–1' of FIG. 5.
Figure 2:
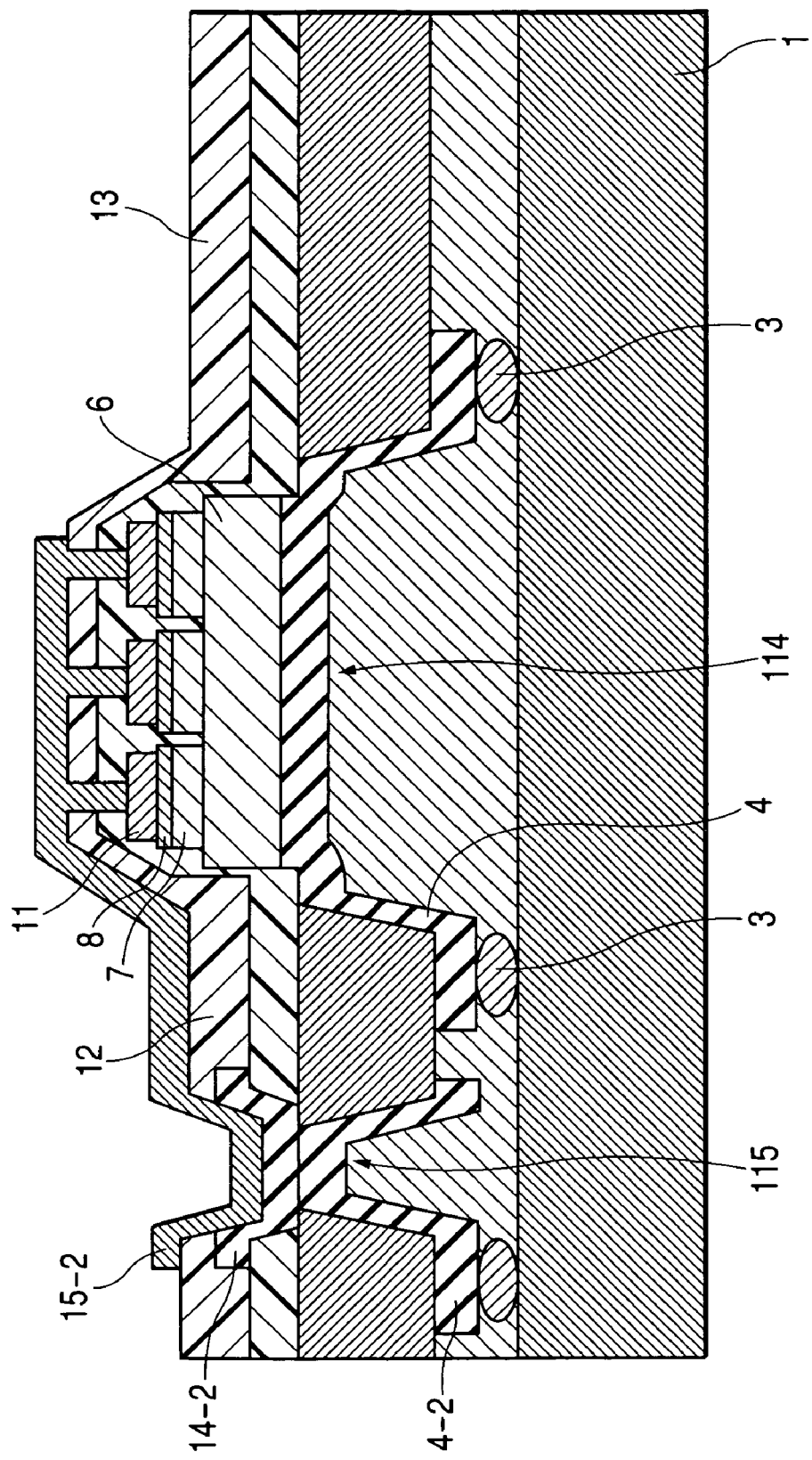
FIG. 2 is a vertical cross-sectional view of the collector top HBT-used semiconductor device taken along line 2O2' of FIG. 5.
Figure 3:
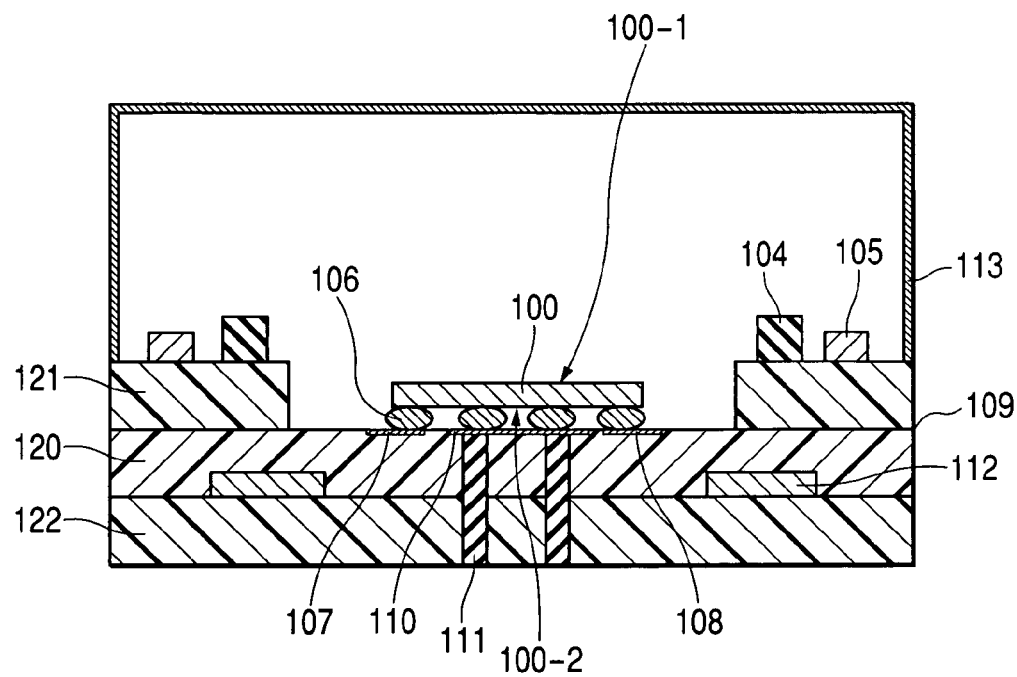
FIG. 3 is a cross-sectional view of a power amplifier module using the semiconductor according to a first embodiment of the present invention.
Figure 4:
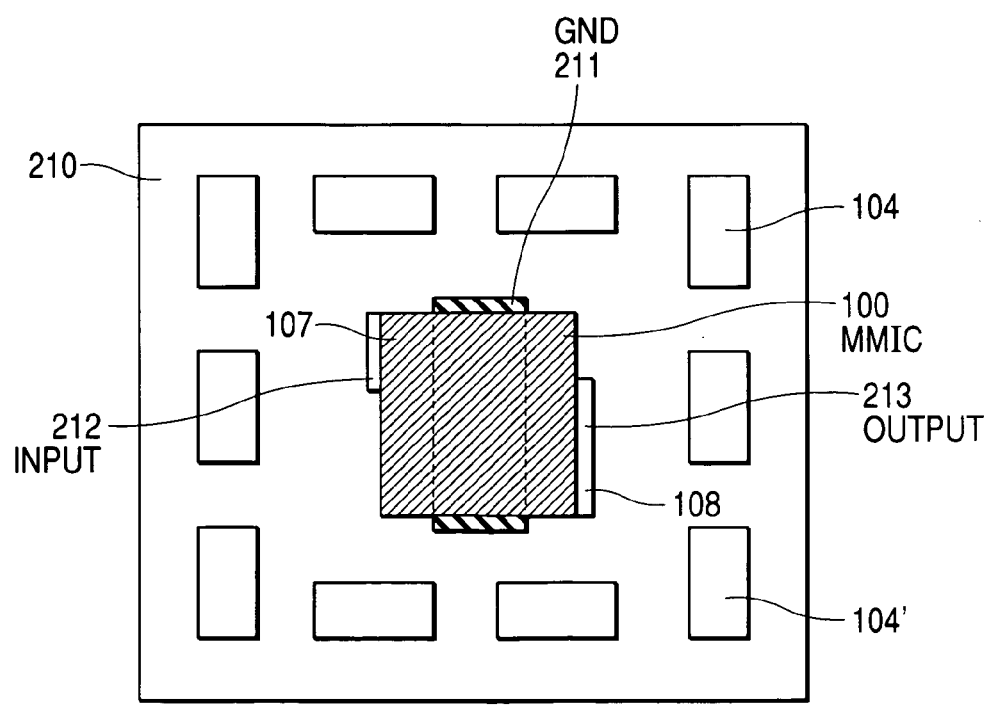
FIG. 4 is a plan view of the power amplifier module of FIG. 3.
Figure 5:
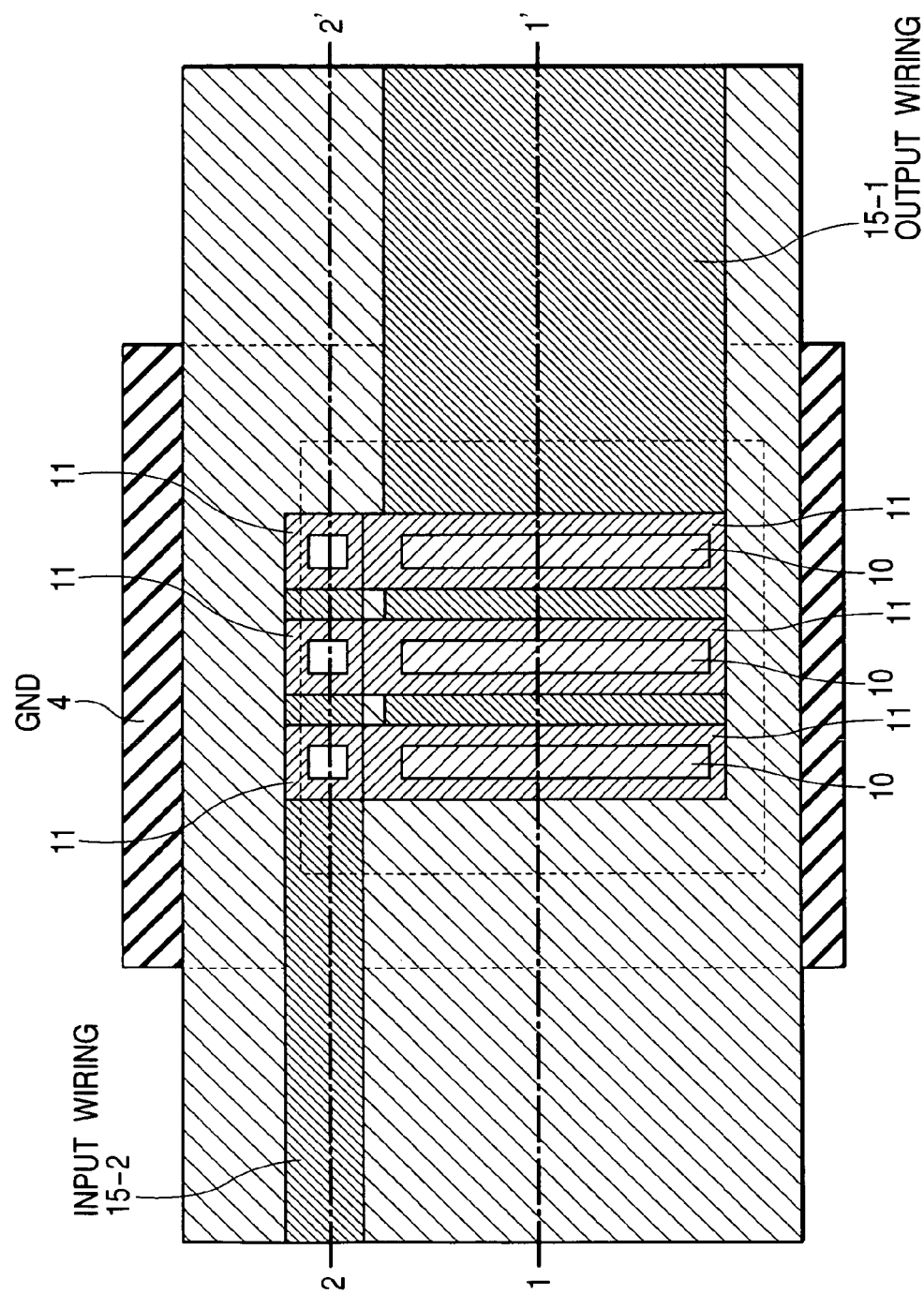
FIG. 5 is a plan view showing the HBT region of the power amplifier module of FIG. 3.

FIG. 3 is a cross-sectional view of a power amplifier module according to a first embodiment; FIG. 4 is its general plan view; and FIG. 5 is an enlarged top view of a MMIC 100 and its vicinity in the power amplifier module. Further, FIGS. 1 and 2 show vertical cross-sectional views of collector top HBT-MMICs used in the compact power amplifier module. They respectively correspond to cut lines 1–1' and 2–2' of FIG. 5.

As shown in FIG. 4, the MMIC 100 is mounted on a module plate 210 with other chip parts 104 and 104', for example, passive elements. Note that the other rectangles, shown around the MMIC 100 and chip parts 104 and 104' in FIG. 4, are also chip parts required for the module although they are not given particular reference numbers. Reference numerals 212, 213 and 211 respectively denote the input, output and ground of the MMIC 100.

FIG. 5 is an enlarged plan view of the MMIC 100 and its vicinity in the power amplifier module. Reference numerals 15-2, 15-1 and 4 in FIG. 5 respectively correspond to the input, output and ground (GND) shown in FIG. 4. Note that the respective parts of the transistor are in FIG. 5 although they are present below wiring layers. The input wiring 15-2 is connected to the base electrodes whereas the output wiring 15-1 is connected to the collector electrodes. The vertical cross-sectional views in FIGS. 1 and 2 are respectively depicted along lines 1–1' and 2–2' shown in FIG. 5.

FIG. 3 is a cross-sectional view of this module embodiment. In this embodiment, the module plate is composed of three layers 121, 120 and 122. For packages, low-temperature sintered glass ceramics plates with a dielectric constant of 8 have usually been used. The layer 121 has an opening where the MMIC 100 is accommodated. Reference numeral 104 denotes a chip part, a passive element, 105 is a transmission line, 106 is a metal bump, 107 is a base input, 108 is a collector output, 109 and 110 are ground planes, 111 is a thermal via, 112 is a bias line, 113 is a metal cap.

Figure 9:
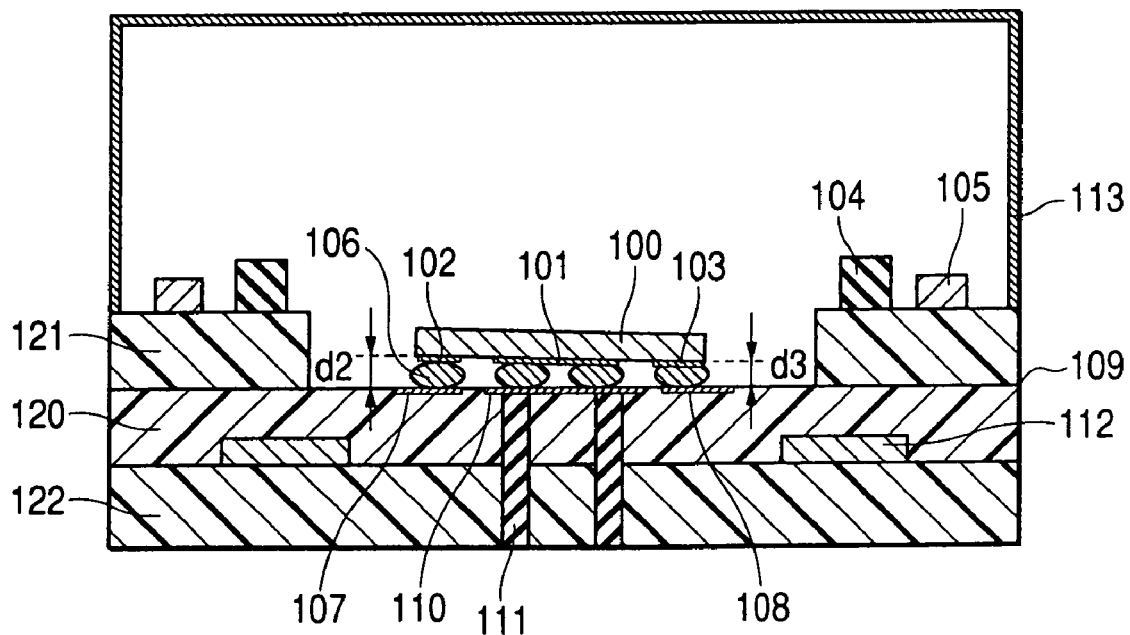
FIG. 9 is a vertical cross-sectional view of a prior art power amplifier module using a semiconductor device.

The MMIC shown in FIGS. 1 and 2 is a high output amplifier and the structure is mounted face up. That is, 100-1 denotes the topside of the MMIC and the collector, base and emitter wiring regions are formed on the topside of the MMIC. A detailed chip configuration of this MMIC is shown in FIG. 1 and FIG. 2. Reference numeral 100-2 denotes the bottom side of the MMIC. Accordingly, it is free from variations in the parasitic capacitance due to such varying distances d2 and d3 as shown in FIG. 9.

Also note that the HBTs shown in FIGS. 1 and 2 are of the collector top type. The semiconductor substrate 5 of the MMIC 100 is bonded to the module plate 1 via metal bumps 3. This semiconductor substrate 5 is described below in detail. In this embodiment, three HBTs are connected in parallel with each other. On a sub-emitter layer 6 formed on the semiconductor substrate, emitter layers 7, base layers 8 and collector layers 9 are formed. The sub-emitter layer 6 is connected to a bottom electrode 4 whereas three coupled collector electrodes 10 are connected to the wiring 15-1. As shown in FIG. 1, this collector wiring 15-1 is connected to a bottom electrode 4-1 via a pad 14-1.

Meanwhile, as shown in FIG. 2, three base electrodes 11, also coupled with each other, are connected to the wiring 15-2. As shown in FIG. 2, this base wiring 15-2 is connected to a bottom electrode 4-2 via a pad 14-2.

In this embodiment, as shown in each figure, an emitter via hole 114 is formed on the bottom of the MMIC so as face the HBTs whereas a based via hole 115 and a collector via hole are positioned on the bottom of the MMIC so as not to face the HBTS.

In the embodiment shown in FIGS. 1 and 2, the base via hole 115 and collector via hole 116 are formed in contact with WSiN electrodes 14 formed on the GaAs substrate 1. Accordingly, their depth is the same as that of the emitter via hole formed right below the HBTs. As a result, multiple via holes can be formed at a time, which is very effective in reducing the cost.

Figure 6:
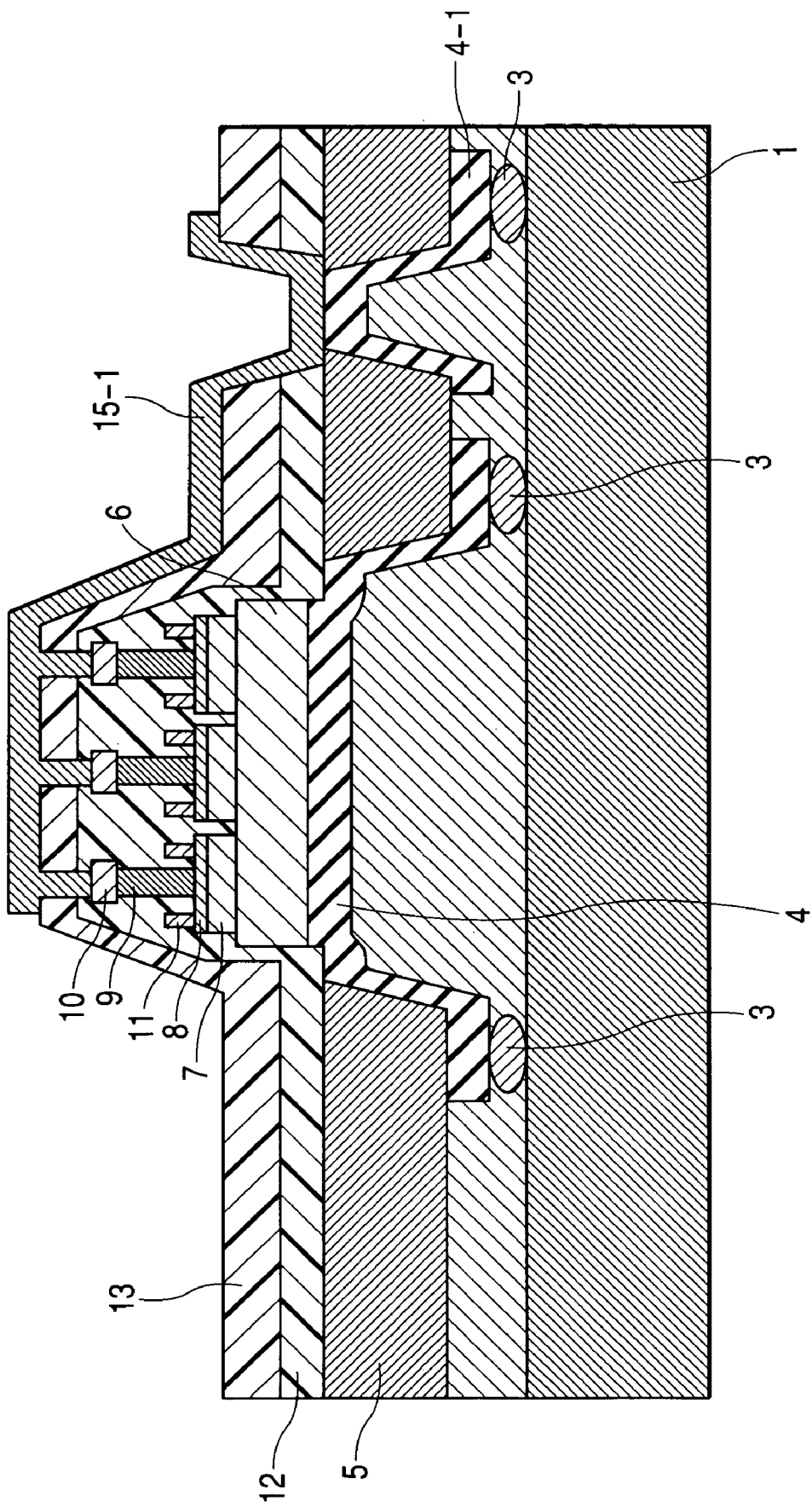
FIG. 6 is a vertical cross-sectional view of a collector top HBT-used semiconductor device according to another embodiment of the present invention.

Alternatively, the surface electrodes for the base via hole 115 and collector via hole 116 can be formed by using the wiring metal layer of Mo/Au or Ti/Au formed on the surface of the GaAs substrate 1. A cross-sectional view in FIG. 6 shows this situation. The description of FIG. 6 is omitted since the embodiment of FIG. 6 is the same as the embodiment of FIG. 1 except for the pad and wiring portions.

Figure 7:
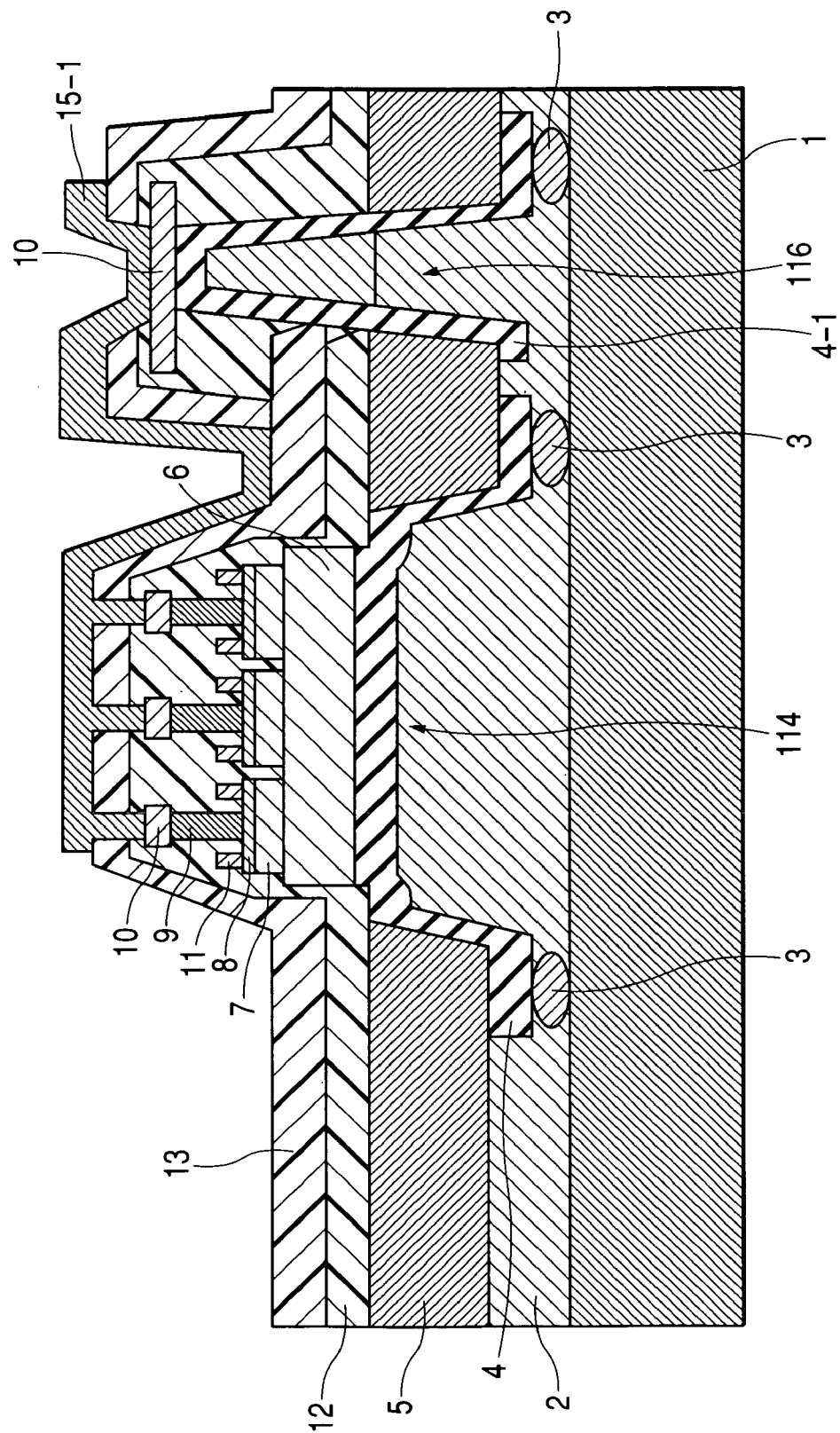
FIG. 7 is a vertical cross-sectional view of a collector top HBT-used semiconductor device according to yet another embodiment of the present invention.
Figure 8:
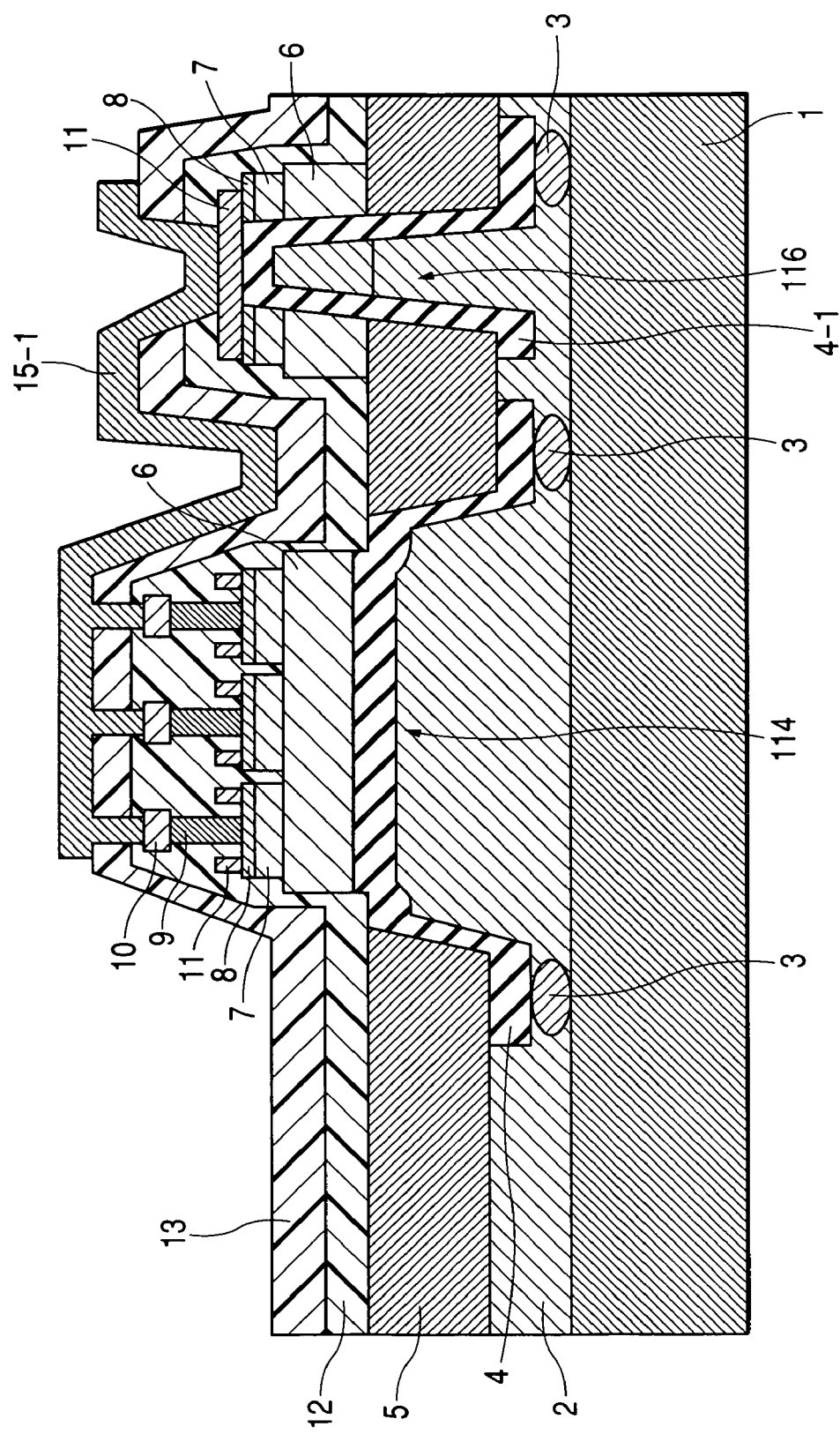
FIG. 8 is a vertical cross-sectional view of a collector top HBT-used semiconductor device according to still another embodiment of the present invention.

In addition, although the via holes of the embodiment have the same depth, they may basically be modified so as to have different depths in the application of the present invention. Such examples are shown in FIGS. 7 and 8 as sectional-views each corresponding to FIG. 1. Note that no base via hole is covered by either cross-sectional view. Although the base via hole 115 (not covered by the sectional-view) and collector via hole 116 are different in depth from the emitter via hole 112, the surface electrodes for the base via hole 115 and collector via hole 116 can be formed in accordance with the present invention. That is, the same effect can also be obtained with such structures in the miniaturization of MMICs and power amplifier modules. However, making the all via holes equal in depth can lower the manufacturing cost since they can be formed by the same process as mentioned earlier. The detailed description of the structures in FIGS. 6 and 7 is omitted since they are the same as, FIG. 1 except for the configuration of the via holes. Each element identical to the counterpart in FIG. 1 is given the same reference numeral as in FIG. 1.

Figure 10:
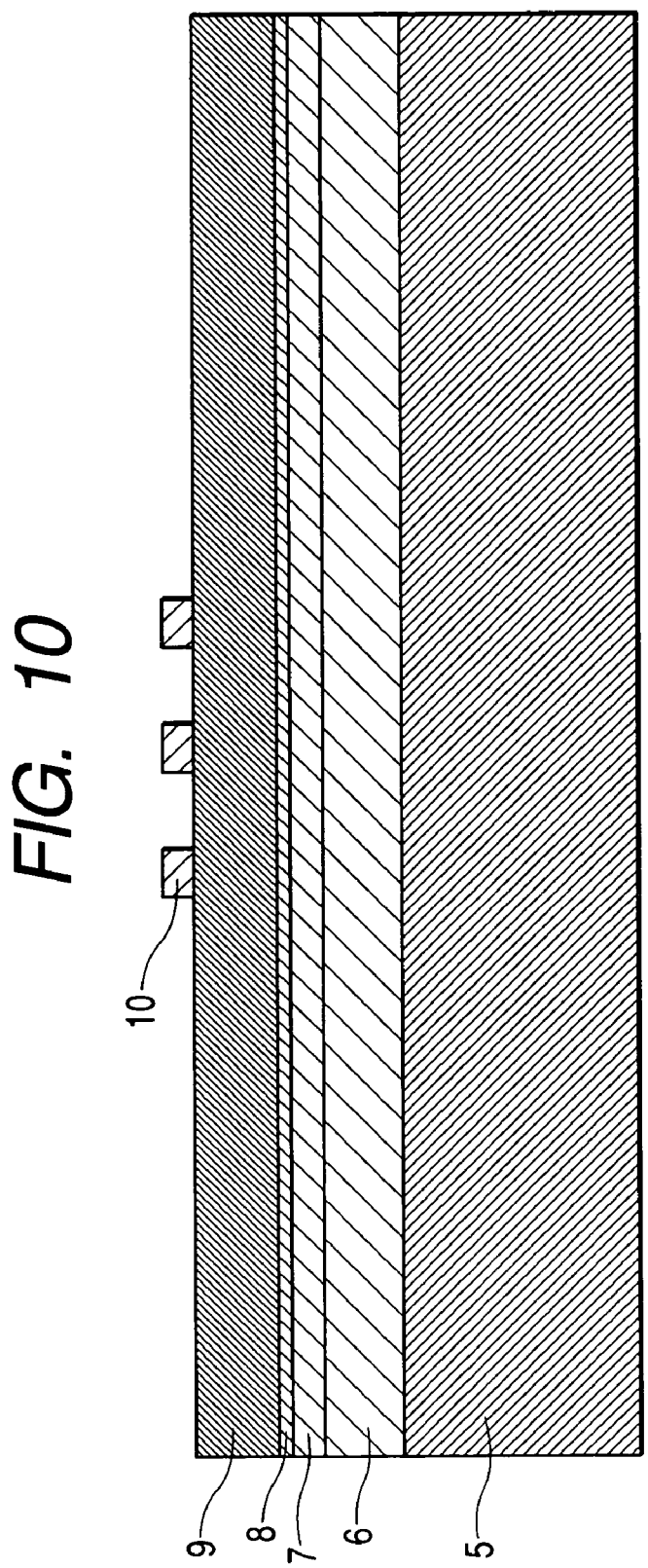
FIG. 10 is a cross-sectional view of a collector top HBT-used semiconductor device in an early stage of manufacture according to an embodiment of the present invention.
Figure 11:
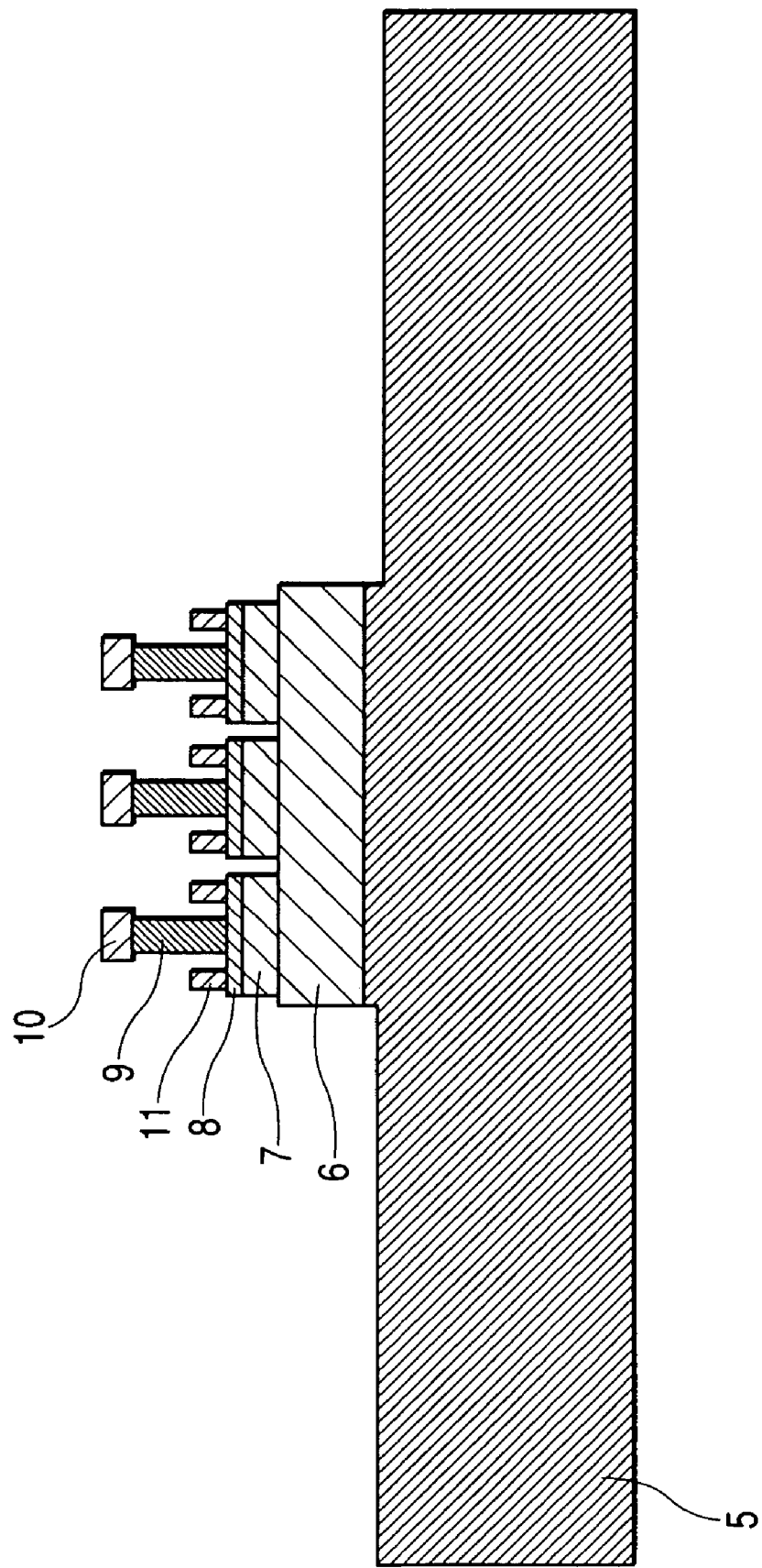
FIG. 11 is a cross-sectional view of the collector top HBT-used semiconductor device in a second stage of manufacture according to the embodiment.
Figure 12:
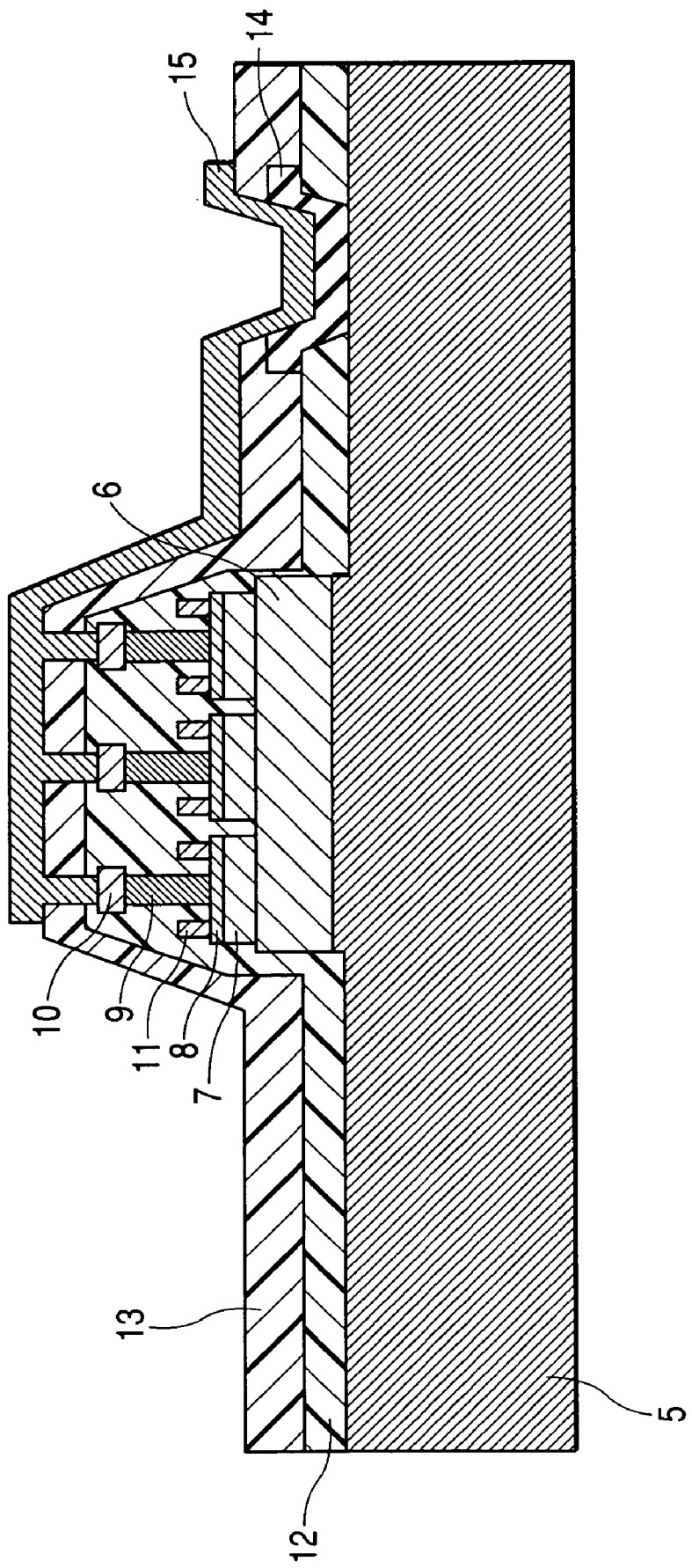
FIG. 12 is a cross-sectional view of the collector top HBT-used semiconductor device in a third stage of manufacture according to the embodiment.
Figure 13:
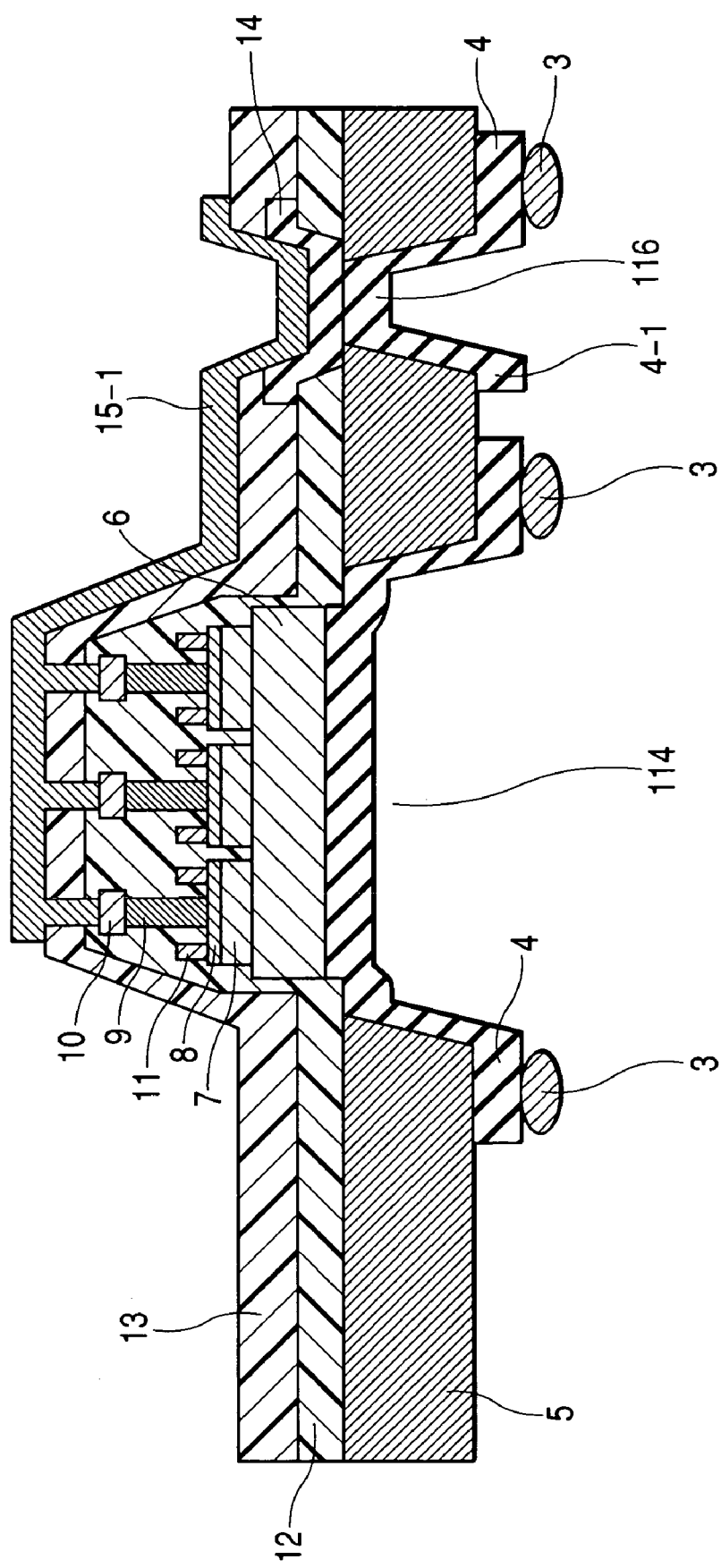
FIG. 13 is a cross-sectional view of the collector top HBT-used semiconductor device in a fourth stage of manufacture according to the embodiment.

Then, with reference to FIGS. 10 to 13, the following describes how to fabricate the collector top HBT-MMIC used in the first embodiment. FIGS. 11 to 13 are cross-sectional views showing the same cross section as in FIG. 1.

Firstly, a highly doped n-type GaAs sub-emitter layer (Si density $5\times10^{18}$ cm$^{-3}$, thickness 0.8 µm) 6, a n-type InGaP emitter layer (InP mol fraction 0.5, Si density $5\times10^{17}$ cm$^{-3}$, thickness 0.2 µm) 7, a p-type GaAs base layer (C density $3\times10^{19}$ cm$^{-3}$, thickness 70 nm) 8 and a n-type InGaAs collector layer (InAs mol fraction varying from 0 to 0.5, Si density $3\times10^{16}$ cm$^{-3}$, thickness 0.8 µm) 9 are grown on a semi-insulating GaAs substrate 5 by metal organic vapor phase epitaxy. Then, after a WSi layer (WSi:Si mol fraction 0.3, thickness 0.3 µm) is deposited on the whole wafer surface by RF sputtering, the WSi layer is processed into a desired pattern to form collector electrodes 10 by photolithography and CF$_4$-used-dry etching (FIG. 10).

Then, using the collector electrodes 10 as mask regions, the n-type InGaAs collector layer 9 is processed into a desired pattern by dry etching with SF$_6$ and SiCl$_4$ and wet etching with a mixture of phosphoric acid, hydrogen peroxide and water.

Subsequently, a widely known method to fabricate collector top HBTs may satisfactorily be employed. That is, boron ions are implanted into the whole surface at a dose of $2\times10^{12}$ cm$^{-2}$ with an acceleration energy of 50 KeV at room temperature to form a high resistance InGaP region (not shown in the figure) in each transistor-parasitic region (around the proper transistor region right below the collector electrode 10) in order to suppress the base current flowing through the parasitic emitter-base junction. Then, base electrodes (Pt (thickness 20 nm)/Ti (thickness 50 nm)/Pt (thickness 50 nm)/Au (thickness 200 nm) stacked) 11 are formed by electron beam vapor deposition and liftoff processing.

Then, the InGaP emitter layer 7 and the GaAs sub-emitter layer 6 are removed to expose the semi-insulating GaAs substrate 5 by photolithography and wet etching with a hydrochloric acid solution and a mixture of phosphoric acid, hydrogen peroxide and water (FIG. 11).

Then, SiO$_2$ (thickness 1 µm) 12 is formed as an inter-layer insulation film by plasma-activated chemical vapor deposition. After this, SiO$_2$ 12 is removed by photolithography and dry etching where the base via hole and collector via hole are to be formed. Then, WSiN (thickness 0.3 µm) is deposited on the whole wafer surface by RF sputtering. After this, a surface electrode for the via hole (not covered by the cross-sectional view) and a surface electrode are formed by photolithography and CF$_4$-used dry etching. Note that this surface electrode 14 for the collector via hole is made of the same material as resistance elements and can be fabricated with resistance elements in the MMIC at a time.

Then, an inter-layer insulation SiO$_2$ film (thickness 1 µm) 13 is formed again by plasma-activated chemical vapor phase deposition. Contact holes are formed by photolithography and dry etching to connect the base electrodes and the contact holes to wiring respectively. The SiO$_2$ 13 is removed where the base via hole and collector via hole have been formed. Then, wiring (Mo (thickness 50 nm)/Au (thickness 800 nm) stacked) 15-1 for the bases and collectors is formed by electron bean vapor deposition and milling (FIG. 12). Alternatively, the wiring 15-1 may be formed as a Ti (thickness 50 nm)/Au (thickness 800 nm) stack by electron beam vaporization and liftoff processing.

Thereafter, the semi-insulating GaAs substrate 5 is attached face down to a glass plate by using an adhesive, and then the GaAs substrate 5 is thinned to a thickness of 50 µm by polishing. The emitter via hole 114, base via hole (not shown) and collector via hole 116 are formed by photolithography and wet etching with a mixture of sulfuric acid, peroxide and water. After an emitter electrode 412 composed of an AuGe (thickness 60 nm)/Ni (thickness 10 nm) layer is formed by electron beam evaporation, alloying is done in the presence of nitrogen at 370° C. for 10 minutes. Finally, metal bumps made of AuSn are formed on the bottom side of the MMIC for the emitters, bases (not shown) and collectors, respectively (FIG. 13).

Then, the MMIC 100 is removed from the glass plate and mounted to the module plate by using a dielectric filler 2. FIGS. 1 and 2 show cross sections of the module obtained through the procedure described so far.

According to this embodiment, a semiconductor device containing HBTs which provide less-varied high-frequency characteristics can be manufactured at a low cost. This semiconductor device embodiment is usefully applicable to a compact power amplifier module with minimized variations in high frequency characteristics.

<Second Embodiment>

The present invention can be applied to power amplifier modules using various types of HBT-MMICs. A second embodiment of the present invention provides a power amplifier module including HBT-MMICs made of InP-based semiconductor compound materials in place of the HBT-MMICs made of GaAs-based semiconductor compound materials employed in the first embodiment. In the subsequent description, a HBT-MMIC using InP-based semiconductor compound materials is referred to simply as an "InP HBT-MMIC".

The structure of this InP HBT-MMIC embodiment is basically the same as the HBT-MMIC in the first embodiment. The materials used in this embodiment are described below. Referring to FIG. 1, the bottom side electrode 4 is made of Ti (thickness 50 nm)/Au (10 µm), the semiconductor substrate 5 is a semi-insulating InP substrate, the sub-emitter layer 6 is made of highly doped n-type InGaAs (InAs mol fraction 0.5, Si density $2\times10^{19}$ cm$^{-3}$, 0.8 µm), the emitter layer 7 is made of n-type InAlAs (InAs mol fraction 0.5, Si density $3\times10^{17}$ cm$^{-3}$, thickness 0.2 µm), the base layer 8 is made of p-type InGaAs (InAs mol fraction 0.5, C density $3\times10^{19}$ cm$^{-3}$, thickness 70 nm) and the collector layer 9 is made of n-type InGaAs (InAs mol fraction 0.5, Si density varied from $3\times10^{16}$ cm$^{-3}$ to $2\times10^{19}$ cm$^{-3}$, thickness 0.8 µm). The fabrication procedure is also the same as that of the first embodiment; layers 6 to 9 are grown by metal organic vapor phase epitaxy with ion implantation.

According to this embodiment, a semiconductor device containing HBTs that provide less-varied high-frequency characteristics can be manufactured at a low cost. This semiconductor device embodiment is usefully applicable as a compact power amplifier module with minimized variations in high frequency characteristics.

The following lists major modes for carrying out the invention.

(1) A semiconductor device comprising: a heterojunction bipolar transistor formed on a semiconductor substrate; a first via hole formed at the bottom of the semiconductor substrate and located so as to face the heterojunction bipolar transistor; and a second and a third via hole formed at the bottom of the semiconductor substrate and located so as not to face the heterojunction bipolar transistor.

(2) A semiconductor device according to Paragraph (1) wherein the heterojunction transistor is a collector top type transistor, the first via hole is an emitter via hole and the second hole and the third via holes are respectively a base via hole and a collector via hole.

(3) A semiconductor device according to Paragraph (1) or (2) wherein: the first via hole has an electrode formed therein so as to cover part of the bottom surface of the semiconductor substrate; the second and the third via hole have respectively electrodes formed therein so as to cover parts of both top and bottom surfaces of the semiconductor substrate; and each of the first, second and third via holes is electrically separated from the others.

(4) A semiconductor device according to Paragraph (3) wherein the respective electrodes, of the second and third semiconductors, formed to cover the parts of the top surface of the semiconductor substrate are in contact with the semiconductor substrate.

(5) A semiconductor device according to Paragraph (4) wherein the electrode to cover the part of the top surface of the semiconductor is made of WSiN or NiCr.

(6) A semiconductor device according to Paragraph (4) wherein the electrode to cover the part of the top surface of the semiconductor is made of Mo/Au or Ti/Au.

(7) A semiconductor device according to Paragraph (5) or (6) wherein: the semiconductor substrate is made of GaAs; and the respective electrodes provided for the first, second, and third via holes to cover the parts of the bottom surface of the semiconductor substrate contains AuGe.

(8) A semiconductor device according to Paragraph (5) or (6) wherein: the semiconductor substrate is made of InP; and the respective electrodes provided for the first, second, and third via holes to cover the parts of the bottom surface of the semiconductor substrate contains Ti.

(9) A method for manufacturing a semiconductor device according to any one of Paragraphs (1) to (8), comprising the steps of: selectively exposing the semiconductor substrate; coating the whole surface with an insulation film; selectively removing the insulation film; coating the whole surface with a metal; and then selectively removing the metal so that the insulation film-removed areas remain covered by the metal.

(10) A high output amplifier module characterized in that the electrodes provided for the first, second and third via holes to cover the parts of the top surface of the semiconductor are electrically connected via metal bumps to metal pads formed on a ceramic or resinous plate.

According to the present invention, a semiconductor device containing HBTs which provide less-varied high-frequency characteristics can be manufactured at a low cost. Semiconductor devices according to the present invention are usefully applicable to compact power amplifier modules with minimized variations in high frequency characteristics.

Reference numerals are briefly explained as follows:

1 . . . Module Plate, 2 . . . Dielectric Filler, 3 . . . Metal Bump, 4 . . . Via Hole Bottom Electrode, 5 . . . Semiconductor Substrate, 6 . . . Sub-emitter Layer, 7 . . . Emitter Layer, 8 . . . Base Layer, 9 . . . Collector Layer, 10 . . . Collector Electrode, 11 . . . Base Electrode, 12, 13 . . . Interlayer Insulation Film, 14 . . . Via Hole Top Electrode, 15 . . . MMIC Surface Wiring Patterns, 100 . . . MMIC, 104 . . . Chip Part, 105 . . . Transmission Line, 106 . . . Metal Bump, 107 . . . Base Input, 108 . . . Collector Output, 109, 110 . . . Ground Plane, 111 . . . Thermal Via, 112 . . . Bias Line, 113 . . . Metal Cap, 114 . . . Emitter Via Hole, 115 . . . Base Via Hole, 116 . . . Collector Via Hole.

What is claimed is:

1. A semiconductor device, comprising:
a semiconductor substrate, and
at least one semiconductor element formed on the semiconductor substrate;
wherein conductor layers connected respectively to desired areas of the semiconductor element are led out of the semiconductor element from a surface of the semiconductor substrate opposite to the other surface on which the semiconductor element is formed;
wherein the semiconductor element is a heterojunction bipolar transistor and the conductor layers connected respectively to a base area, an emitter area and a collector area of the heterojunction bipolar transistor are led out from the surface of the semiconductor substrate opposite to the other surface on which the base, emitter and collector areas are formed;
wherein the bottom surface of the semiconductor substrate has a first opening located so as to face the heterojunction bipolar transistor, and a second opening and a third opening both located so as not to face the heterojunction bipolar transistor; and
wherein the conductor layers connected respectively to the base, emitter and collector areas of the heterojunction bipolar transistor are led out of the heterojunction bipolar transistor through the first, second and third openings.

2. A semiconductor device according to claim 1 wherein:
the first opening has a conductor layer formed therein and extended so as to cover a part of the surface of the semiconductor substrate opposite to the surface on which the base, emitter and collector areas are formed;
the second and third openings have respectively conductive layers formed therein and extended so as to cover parts of both the surface of the semiconductor substrate on which the base, emitter and collector areas are formed and the opposite surface of the semiconductor substrate; and
each of the first, second and third openings is electrically separated from the others.

3. A semiconductor device according to claim 1 wherein the conductor layers provided for the second and third openings and formed on the surface on which the base, emitter and collector areas are formed are in contact with the semiconductor substrate.

4. A semiconductor device according to claim 1 wherein:
the heterojunction bipolar transistor is of the collector top type; and
the first, second and third openings are an emitter via hole, a base via hole and a collector via hole, respectively.

5. A semiconductor device according to claim 4 wherein:
the first opening has a conductor layer formed therein and extended so as to cover a part of the surface of the semiconductor substrate opposite to the surface on which the base, emitter and collector areas are formed;
the second and third openings have respectively conductive layers formed therein and extended so as to cover parts of both the surface of the semiconductor substrate on which the base, emitter and collector areas are formed and the opposite surface of the semiconductor substrate; and each of the first, second and third openings is electrically separated from the others.

* * * * *